United States Patent
Tanoue et al.

(10) Patent No.: US 8,229,373 B2
(45) Date of Patent: Jul. 24, 2012

(54) HIGH FREQUENCY POWER AMPLIFIER, TRANSMITTER AND MOBILE COMMUNICATION TERMINAL USING THE POWER AMPLIFIER

(75) Inventors: Tomonori Tanoue, Machida (JP); Hidetoshi Matsumoto, Kokubunji (JP)

(73) Assignee: Renesas Electronics Corporation, Kanagawa (JP)

( * ) Notice: Subject to any disclaimer, the term of this patent is extended or adjusted under 35 U.S.C. 154(b) by 859 days.

(21) Appl. No.: 11/430,172

(22) Filed: May 9, 2006

(65) Prior Publication Data
US 2006/0267688 A1 Nov. 30, 2006

(30) Foreign Application Priority Data
May 11, 2005 (JP) ................................. 2005-138142

(51) Int. Cl.
*H01Q 11/12* (2006.01)
(52) U.S. Cl. ............... 455/127.1; 455/127.3; 455/114.1; 455/240.1; 455/114.2; 455/114.3
(58) Field of Classification Search ............... 455/240.1, 455/127.1, 127.3, 114.1, 114.2, 114.3; 330/51, 330/124, 295, 136, 297, 129, 10, 149, 278, 330/133; 375/297
See application file for complete search history.

(56) References Cited

U.S. PATENT DOCUMENTS

| | | | | |
|---|---|---|---|---|
| 4,312,032 A * | 1/1982 | Kirby | | 363/97 |
| 5,204,637 A * | 4/1993 | Trinh | | 330/129 |
| 5,304,859 A * | 4/1994 | Arimoto | | 327/535 |
| 5,381,115 A * | 1/1995 | Timmons et al. | | 330/279 |
| 5,530,922 A | 6/1996 | Nagode | | |
| 5,640,691 A * | 6/1997 | Davis et al. | | 455/126 |
| 5,673,001 A * | 9/1997 | Kim et al. | | 330/284 |
| 5,689,815 A * | 11/1997 | Yamazaki et al. | | 455/69 |
| 6,134,424 A * | 10/2000 | Nishihori et al. | | 455/127.1 |
| 6,148,220 A * | 11/2000 | Sharp et al. | | 455/572 |
| 6,201,437 B1 * | 3/2001 | Kono et al. | | 327/545 |
| 6,297,694 B1 * | 10/2001 | Yamamoto | | 330/51 |
| 6,472,926 B2 * | 10/2002 | Taito et al. | | 327/536 |
| 6,557,190 B2 * | 5/2003 | Bailey | | 5/118 |
| 6,559,717 B1 * | 5/2003 | Lynn et al. | | 330/133 |
| 6,674,323 B2 * | 1/2004 | Kagaya et al. | | 330/51 |
| 6,720,831 B2 | 4/2004 | Dening et al. | | |
| 6,985,033 B1 * | 1/2006 | Shirali et al. | | 330/149 |

(Continued)

FOREIGN PATENT DOCUMENTS
JP 02-206905 8/1990
(Continued)

OTHER PUBLICATIONS

Office Action from Japanese Patent Office dated Sep. 15, 2009, in English.

(Continued)

*Primary Examiner* — Edward Urban
*Assistant Examiner* — Ganiyu Hanidu
(74) *Attorney, Agent, or Firm* — Stites & Harbison, PLLC; Juan Carlos A. Marquez Esq

(57) ABSTRACT

A high frequency power amplifier maintains an excellent linearity regardless of a fluctuation of a load impedance and is downsized. The high frequency power amplifier detects an AC voltage amplitude at an output terminal of a final amplification stage transistor, and suppresses an input signal amplitude of a power amplifier when the voltage amplitude exceeds a predetermined threshold value.

17 Claims, 16 Drawing Sheets

U.S. PATENT DOCUMENTS

| | | | |
|---|---|---|---|
| 7,030,681 B2* | 4/2006 | Yamazaki et al. | 327/534 |
| 7,395,036 B2* | 7/2008 | Akamine et al. | 455/126 |
| 7,496,338 B1* | 2/2009 | Groe et al. | 455/240.1 |
| 2002/0011883 A1* | 1/2002 | Yamazaki et al. | 327/143 |
| 2002/0030541 A1* | 3/2002 | Tsutsui et al. | 330/133 |
| 2003/0102924 A1* | 6/2003 | Matsumoto et al. | 330/310 |
| 2004/0071225 A1* | 4/2004 | Suzuki et al. | 375/297 |
| 2004/0145417 A1* | 7/2004 | Matsumoto et al. | 330/295 |
| 2005/0168281 A1* | 8/2005 | Nagamori et al. | 330/133 |
| 2005/0176388 A1* | 8/2005 | Yamawaki et al. | 455/126 |
| 2005/0208907 A1* | 9/2005 | Yamazaki et al. | 455/126 |
| 2006/0139092 A1* | 6/2006 | Sundstrom et al. | 330/124 R |

FOREIGN PATENT DOCUMENTS

| | | |
|---|---|---|
| JP | 07-221656 | 1/1994 |
| JP | 8-505751 | 6/1996 |
| JP | 2000-101663 | 9/1998 |
| JP | 2000-341143 | 5/1999 |
| JP | 2004-023424 | 1/2004 |
| WO | WO2004/027990 * | 1/2004 |
| WO | WO 2004/027990 A1 | 4/2004 |

OTHER PUBLICATIONS

Offer of Information Form from Japanese Patent Office for Japanese Patent Application No. 2005-138142, dated Sep. 24, 2010.

* cited by examiner

US 8,229,373 B2

HIGH FREQUENCY POWER AMPLIFIER, TRANSMITTER AND MOBILE COMMUNICATION TERMINAL USING THE POWER AMPLIFIER

CLAIM OF PRIORITY

The present application claims priority from Japanese application JP 2005-138142 filed on May 11, 2005, the content of which is hereby incorporated by reference into this application.

FIELD OF THE INVENTION

The present invention relates to a high frequency power amplifier used in a high frequency mobile communication terminal and a transmitter using the power amplifier, and more particularly to a high frequency power amplifier that reduces a load impedance dependency of the amplifier characteristic, and a transmitter using the power amplifier.

BACKGROUND OF THE INVENTION

Japanese Patent Laid-Open No. 2000-341143 discloses an example of a structure of a conventional amplifier that reduces a dependency of the characteristic on a load impedance. The amplifier disclosed in Japanese Patent Laid-Open No. 2000-341143 conducts detection at plural points on a transmission line between a power amplifier and an antenna, detects the occurrence of a standing wave, that is, a mismatching of a load on the basis of a difference between the detected levels, and limits an input of the power amplifier.

Also, U.S. Pat. No. 6,720,831 discloses a structure that detects a voltage outputted from a final-stage transistor, and feeds back the detected voltage to a bias voltage of the final-stage transistor.

SUMMARY OF THE INVENTION

In a power amplifier used for a high frequency mobile communication terminal, a power can be reflected from an antenna toward the power amplifier depending on a circumstance around the antenna. In the case where the power reflection thus occurs, it appears as if the load impedance from the amplifier with the antenna calculated fluctuates. When the load impedance viewed from the amplifier fluctuates, the load impedance of a transistor at an output stage that constitutes the amplifier also fluctuates with the result that the amplifier exhibits the characteristic different from the characteristic that has been originally designed.

As one example, FIG. 1 schematically shows an influence of the load impedance fluctuation with respect to the gain of an amplifier, that is an input to output characteristic. Referring to FIG. 1, the axis of abscissa is an input FRin to the amplifier, and the axis of ordinate is an output FRout of the power amplifier. A characteristic (2) exhibits an original input to output characteristic, and there occurs a characteristic (1) that is higher in the gain but lower in the saturation output than the characteristic (2), or a characteristic (3) that is lower in the gain but higher in the saturation output than the characteristic (2), depending on the circumstance around the antenna.

Now, in a CDMA system that is required that the power amplifier operates as a linear amplifier, the characteristic indicated by the characteristic (1) of FIG. 1 saturates the output at a lower output than the original linear maximum output, resulting in such a problem that a distortion that exceeds a permissible value of the system may occur.

To solve the above problem, there is an effective countermeasure that an isolator is inserted between the antenna and the power amplifier so that the reflected power from the antenna is not returned to the amplifier as shown in FIG. 5 of Japanese Patent Laid-Open No. 2000-341143. However, there arises such a problem that the isolator is expensive, and the power amplifier is not downsized.

Also, in the conventional example shown in FIG. 1 of Japanese Patent Laid-Open No. 2000-341143, the voltage amplitudes at three different points on an output matching circuit are measured, and a difference between the amplitudes of the standing waves that occur on the transmission line is read to detect the occurrence of the reflective wave to limit a control voltage level. However, the above structure requires a transmission line length that is about ⅙ of the wavelength and three voltage detector circuits, resulting in such a problem that the power amplifier is not downsized.

On the other hand, in an example shown in FIG. 2A of U.S. Pat. No. 6,720,831, only one voltage detector is required because a voltage is detected at an output end of a sensing transistor, however an object of U.S. Pat. No. 6,720,831 is to prevent a power transistor from being broken down by detecting an overvoltage by a detector. In the case where overvoltage is detected, a bias current of the power transistor is reduced. This example suffers from such a problem that there is the possibility that the linearity of the power amplifier is deteriorated to produce a distortion because the linearity of the power amplifier is not taken into consideration.

The present invention has been made to solve the above problem, and therefore an object of the present invention is to provide a high frequency power amplifier that maintains an excellent linearity regardless of a fluctuation of the load impedance and is readily downsized, and a transmitter using the power amplifier.

A representative example of the present invention will be stated below.

That is, according to the present invention, there is provided a high frequency power amplifier that is used for a high frequency mobile communication terminal, the high frequency power amplifier comprising: at least one stage amplification stage that amplifies an input signal from a gain variable amplifier; an output matching circuit that is outputted to an output side of the amplification stage; and a first detector unit that detects a voltage amplitude at a node between a transistor which constitutes the amplification stage and the output matching circuit to output the detected voltage amplitude as gain control information of the gain variable amplifier.

According to the present invention, there can be provided a high frequency power amplifier that maintains an excellent linearity regardless of a fluctuation of the load impedance, and a transmitter using the power amplifier.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

First Embodiment

Figure 2:
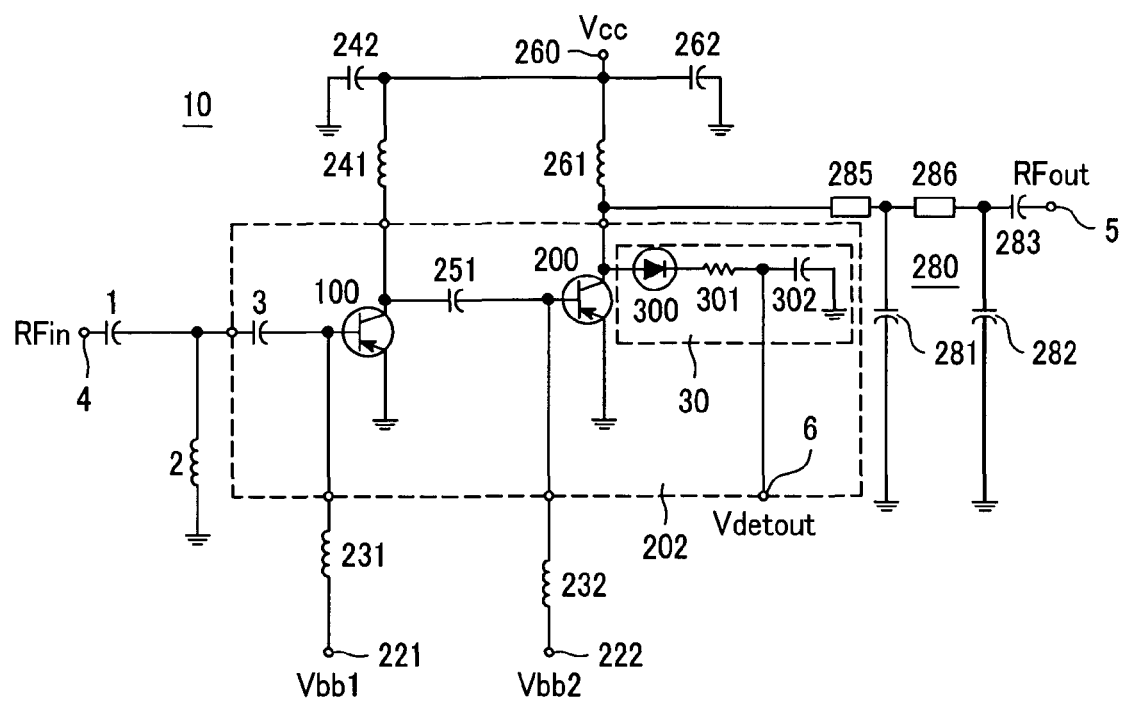
FIG. 2 is a circuit diagram showing a power amplifier according to a first embodiment of the present invention.

First, a description will be given of a structure of a high frequency power amplifier according to a first embodiment of the present invention with reference to FIG. 2. FIG. 2 is a circuit diagram showing a high frequency power amplifier 10 according to the first embodiment of the present invention.

According to the first embodiment of the present invention, the high frequency power amplifier 10 detects an AC voltage amplitude at an output terminal of a final amplification stage transistor, and outputs a signal for suppressing an input signal amplitude of the power amplifier when the detected voltage amplitude exceeds a predetermined specified value.

In other words, in the high frequency power amplifier 10 shown in FIG. 2, reference numeral 1 and 3 denote input matching capacitors of the amplifier, and 2 is an input matching inductor. Reference numeral 100 denotes an initial stage amplification transistor, 200 is a final stage amplification transistor, and 30 is a collector AC voltage detector unit (first detector unit). Reference numeral 202 is a MMIC (microwave monolithic IC) that integrates the input matching capacitor 3, the initial stage amplification transistor 100, the final stage amplification transistor 200, an interstage matching capacitor 251, and the collector AC voltage detector unit 30 into one chip.

The power amplifier 10 includes an input terminal 4 to which an RF input signal RFin is inputted, an output terminal 5 from which an RF output signal RFout is outputted, and an output terminal 6 from which a detected output Vdetout of the AC voltage detector unit (first detector unit) 30 is outputted. The detected output Vdetout of the first detector unit is used as information for controlling the gain variable amplifier that supplies the RF input signal to the input terminal 4.

A terminal 221 and a terminal 222 supply base biases Vbb1 and Vbb2 to the initial stage amplification transistor 100 and the final stage amplification transistor 200, respectively. Reference numeral 231 denotes an RF signal isolation inductor for base bias voltage supply of the initial stage amplification transistor 100, and 232 is an RF signal isolation inductor for base bias voltage supply of the final stage amplification transistor 200. Reference numeral 260 denotes a power supply terminal that supplies a supply voltage Vcc, and 241 and 261 are choke inductors for power supply of the initial and final amplification transistors, respectively. Reference numeral 242 and 262 denote bypass capacitors for supply voltage stabilization, respectively.

The collector AC voltage detector unit 30 includes a voltage detection diode 300, a voltage detection resistor 301, and a voltage detection capacitor element 302. An output matching circuit 280 of the amplifier is made up of output matching capacitors 281, 282, and 283, and output matching transmission lines 285 and 286.

According to this embodiment, the first detector unit 30 detects the voltage amplitude Vdetout at a node between the final stage amplification transistor at the amplification stage and the output matching circuit, and outputs the detected voltage amplitude as control information of the gain variable amplifier that supplies the RF input signal to the input terminal 4. The use of the detected output Vdetout makes it possible to control the gain of the gain variable amplifier according to the output voltage amplitude Vdetout of the amplification transistor which corresponds to a fluctuation of the load impedance. As a result, the input signal amplitude of the power amplifier, that is, the output of the gain variable amplifier can be controlled so that the output of the high frequency power amplifier is always in a linear operation region where there is no distortion of the output, thereby making it possible to suppress the distortion from occurring at the time of fluctuating the load impedance. Since it is unnecessary to insert an isolator between the antenna and the power amplifier, the costs are not increased.

Also, the transistors at the respective stages which constitute the high frequency power amplifier according to this embodiment is a self bias system that allows the bias current to increase upon inputting the RF input signal RFin. As a result, even when the distortion occurs at the time of fluctuating the load impedance, the amplitude of the RF input signal is reduced without reducing the bias currents of the transistor power amplifiers at the respective stages. In other words, the amplitude of the RF input signal RFin is in an operating range of the self bias system which corresponds to the RF input voltage. For that reason, when the amplitude of the RF input signal is reduced, the bias current is also reduced according to the reduced RF input signal. From this viewpoint, the transistors at the respective stages operate within the regular operation range even when the distortion occurs at the time of fluctuating the load impedance. As a result, the operation in the linear region is ensured.

Also, since the output terminal 6 of the collector AC voltage detector unit 30 is connected to the collector of the final stage amplification transistor 200, the output of the collector AC voltage detector unit 30 is coupled with the information on the supply voltage, which is effective in suppression of the distortion.

Second Embodiment

A description will be given of an example of a transmitter using the power amplifier of the first embodiment according to a second embodiment of the present invention with reference to FIGS. 3 to 5C.

Figure 3:
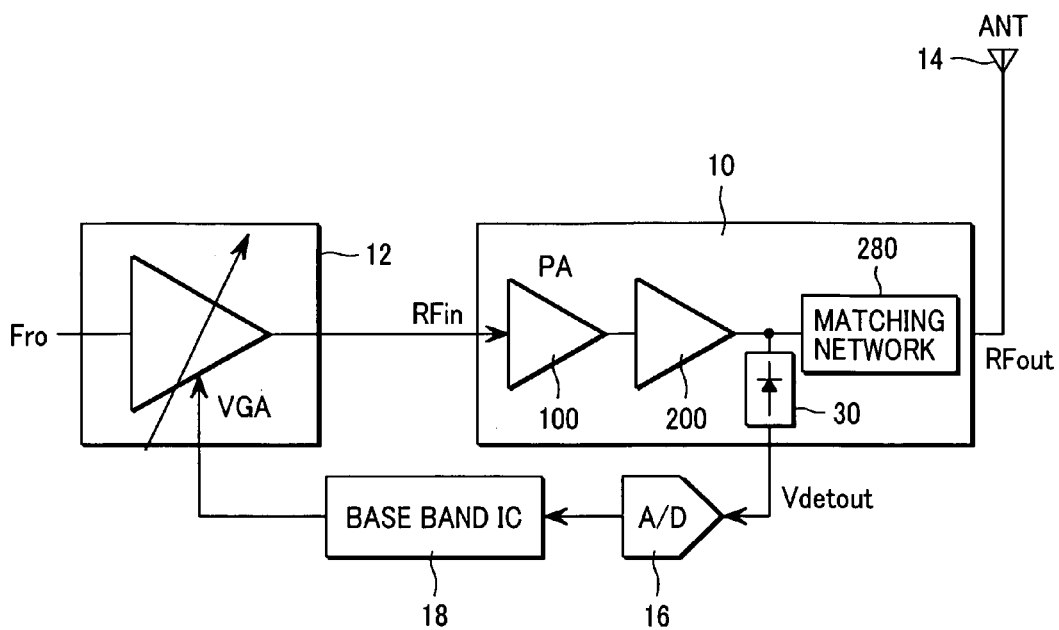
FIG. 3 is a block diagram showing a transmitter according to a second embodiment of the present invention.

First, FIG. 3 is a block diagram showing a structural example of a transmitter to which the power amplifier shown in FIG. 2 is applied. The power amplifier 10 has an RF input signal RFin terminal 4 connected to an external gain variable amplifier 12, and has an RF output signal RFout terminal 5 connected to an antenna 14. Also, the power amplifier 10 has a terminal 6 that outputs an AC voltage amplitude output Vdetout of the collector AC voltage detector unit 30 in the power amplifier 10 connected to a control circuit 18 through an A/D converter 16. The control circuit 18 is disposed within the transmitter, more preferably within a base band control circuit (base band IC).

A high frequency transmit signal Fr0 obtained by modulating a carrier wave in phase on the basis of information to be transmitted is inputted to the gain variable amplifier 12, then amplified by the amplifier, and inputted to the power amplifier 10 as the high frequency signal RFin. The signal is further amplified by the power amplifier 10, outputted as the high frequency signal RFout, and drives the antenna 14 and conducts transmission. The detected output Vdetout is used as information for gain control of the gain variable amplifier 12. In other words, the control circuit 18 controls the gain of the gain variable amplifier 12 according to the output Vdetout of the AC voltage amplitude that is detected by the collector AC voltage detector unit 30.

According to this embodiment, the control circuit 18 monitors Vdetout as the information for gain control, and generates such a control signal as to limit the gain of the gain variable amplifier 12 when a condition under which a distortion occurs in the output of the power amplifier 10 is satisfied, that is, when the output voltage amplitude of the amplification transistor exceeds a predetermined threshold value. In other words, the control circuit 18 controls the gain of the gain variable amplifier 12 according to the output voltage amplitude of the amplification transistor 200. When the load impedance is equal to or lower than a normal range, the gain of the gain variable amplifier 12 is set on the basis of a given parameter. When the condition under which the distortion occurs in the output of the power amplifier 10 is satisfied, that is, when the output voltage amplitude Vdetout of the amplification transistor 200 exceeds a predetermined threshold value with an increase in the load impedance, the gain of the gain variable amplifier 12 is limited to a gain lower than a normal gain of the gain variable amplifier 12. As a result, the high frequency power amplifier 10 operates in a region where no distortion occurs in the output thereof.

With the above operation, the high frequency amplifier 10 maintains excellent linearity regardless of the fluctuation of the load impedance. As a result, the output of the gain variable amplifier 12, that is, the input signal amplitude of the power amplifier is so controlled as to be in a region where no distortion occurs in the output of the high frequency power amplifier, thereby making it possible to suppress the occurrence of distortion at the time of fluctuating the load impedance.

According to the structure of the power amplifier according to the first embodiment or the transmitter according to this embodiment, the occurrence of distortion can be suppressed at the time of fluctuating the load impedance. Hereinafter, this feature will be described in more detail.

Figure 1:
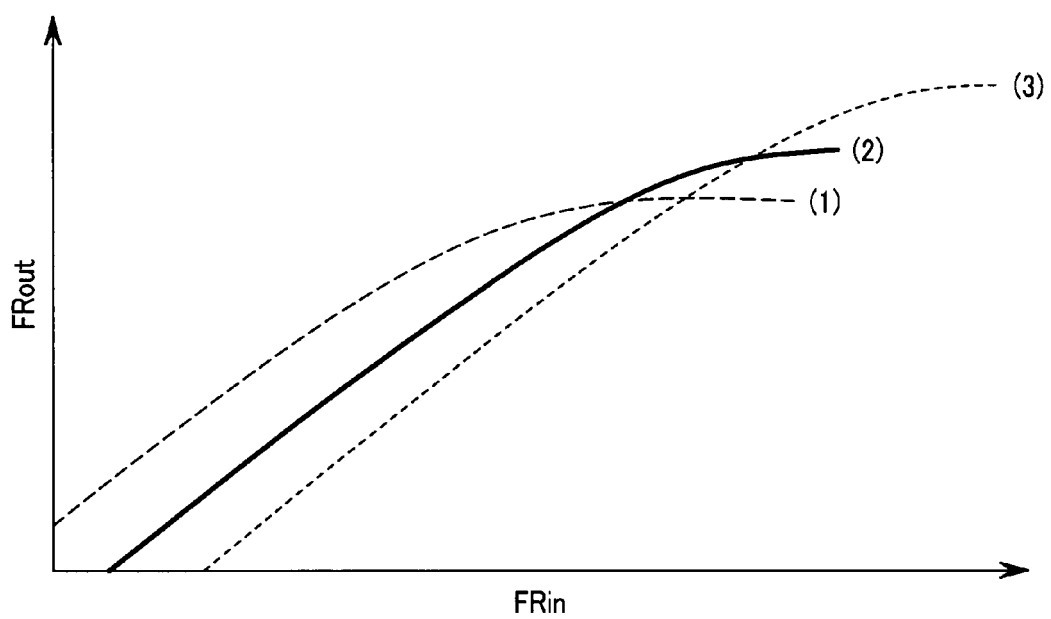
FIG. 1 is a schematic diagram showing an input to output characteristic of a power amplifier accompanying a fluctuation of a load impedance.
Figure 4A:
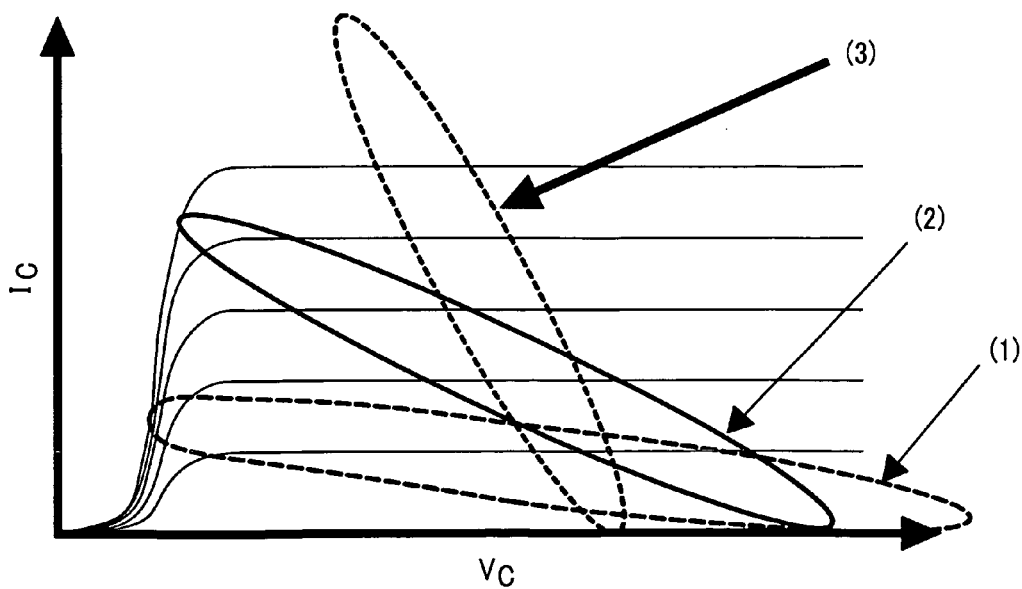
FIG. 4A is a schematic diagram showing a dynamic load curve of a transistor due to a fluctuation of the load impedance according to the first or second embodiment of the present invention.

FIG. 4A is a diagram schematically showing a collector current to collector voltage characteristic of the output stage transistor in the power amplifier 10, and a relationship between a voltage Vc and a collector current Ic at the collector terminal in the RF large signal amplifying operation, that is a dynamic load curve. A real part of the load impedance corresponds to a slope of the dynamic load curve shown in FIG. 4A, and therefore the collector current to collector voltage characteristics (1) to (3) shown in FIG. 1 approximately correspond to the collector current to collector voltage characteristics (1) to (3) shown in FIG. 4A.

Figure 4B:
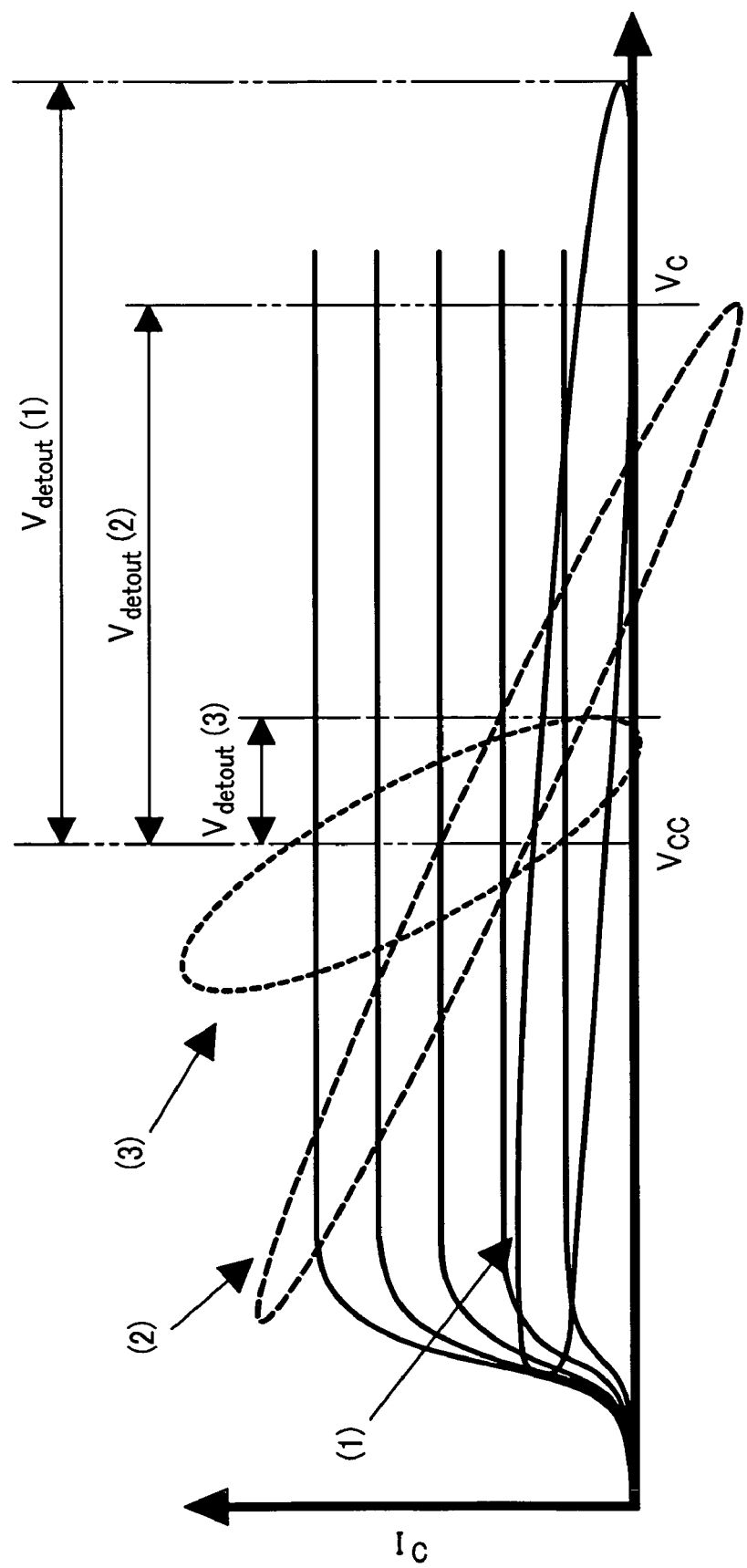
FIG. 4B is a diagram showing a relationship of a collector current to collector voltage characteristic and Vdetout that is detected by a collector AC voltage detector unit according to the first or second embodiment.

FIG. 4B shows a relationship of collector current to collector voltage characteristics (1) to (3), and Vdetout (1) to (3) that are detected by the collector AC voltage detector unit 30 in correspondence with those collector current to collector voltage characteristics.

A distortion is difficult to occur in the collector current to collector voltage characteristics (2) and (3) of FIG. 4A, but a dynamic load curve is distort distorted without drawing an oval at a lower voltage side in (1). Since the dynamic load curve is thus distorted, the output saturation occurs at a lower output than the original input to output characteristic (2) as indicated by (1) in FIG. 1.

In the dynamic load curve (1) of FIG. 4A, the dynamic load curve is distorted at the lower voltage side, and the load curve extends toward the higher voltage side. On the other hand, in the dynamic load curve (3) of FIG. 4A, the voltage remains at a low voltage. From this viewpoint, it is estimated that there is a correlation between the occurrence of a distortion and an RF voltage at the collector end.

The output matching circuit 280 of the power amplifier 10 is normally matched with the impedance of 50 ohms. When a load that is different from 50 ohms is connected to the power amplifier 10, a reflection occurs from the load. As a result, the input to output characteristic is exhibited as indicated by (1) and (3) of FIG. 1, and a distortion may occur in the output as described above.

In the mobile terminal of the W-CDMA system, a reflection from the antenna is attenuated due to the loss of a part that is inserted between the power amplifier 10 and the antenna 14, and the mismatching of the output RFout becomes about 4:1 or less in a voltage standing wave ratio (VSWR) at the output terminal 5 of the power amplifier.

Figure 5A:
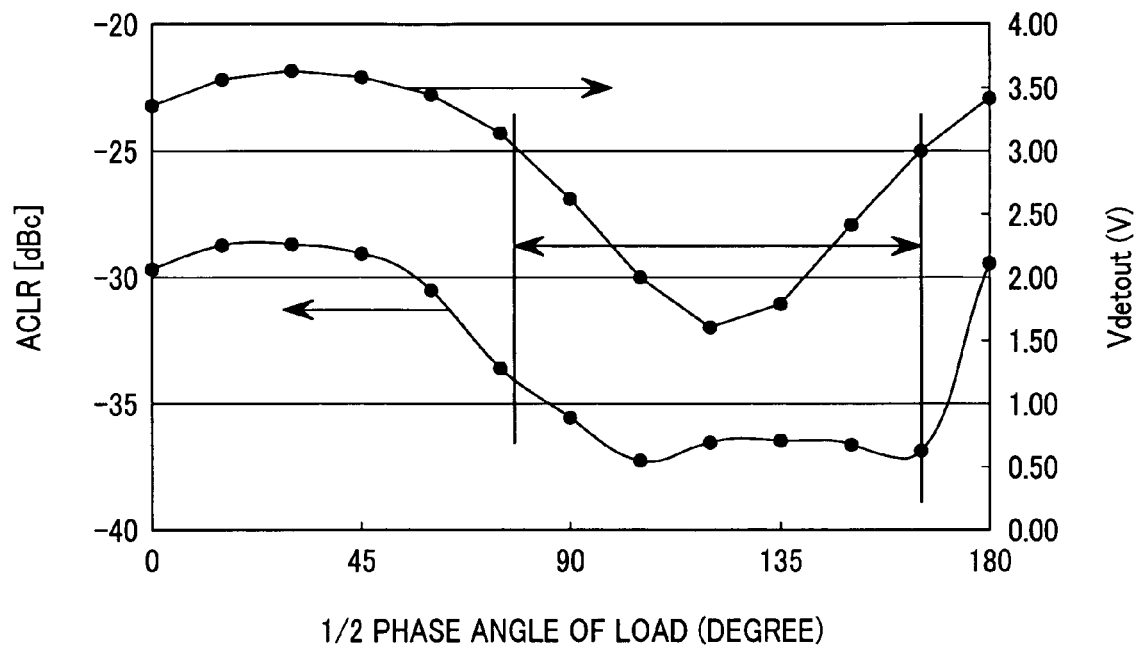
FIG. 5A is a diagram showing a distortion of a power amplifier and an AC voltage amplitude of a collector end accompanying a phase fluctuation of the load impedance according to the first or second embodiment of the present invention.

In FIG. 5A, the AC voltage amplitude Vdetout at the collector end of the transistor 200 of the amplifier 10 shown in FIG. 2, and an Adjacent Channel Leak power Ratio (ACLR) that is an index indicative of the distortion of the W-CDMA signal are obtained by a circuit simulation in the case of VSWR=4:1. In this simulation, in order to set the VSWR to 4:1, the load impedance is set to 200 ohms, and a transmission line is inserted between the load and the power amplifier 10 to represent a phase of the reflection from the antenna 14. The phase rotation of the transmission line changes from 0° to 180° with the results that the phase rotation of 0° to 360° there and back is conducted, and all of cases are conducted. The characteristics when the simulated power amplifier has a load of 50 ohms are 27.5 dBm in the output power when the supply voltage Vcc is 3.5 V and the input power is 1 dBm, and ACLR at that time is −42 dBc.

Referring to FIG. 5A, an upper trace is the AC voltage amplitude Vdetout, and a lower trace is the adjacent channel leak power ratio ACLR. It is apparent from FIG. 5A that there is an excellent correlation with the output Vdetout of the AC voltage amplitude to the adjacent channel leak power ratio ACLR. In a region of Vdetout <3 V indicated by arrows in FIG. 5A, ACLR is −34 dBc even at worst, which is lower than −33 dBc which is the worst value of ACLR of 3GPP standard that is the standard of the W-CDMA system. Thus, it is found that the control unit 18 of FIG. 3 controls the gain variable amplifier 12 so as to satisfy Vdetout <3 V with Vdetout=3 V as a threshold voltage, to thereby realize the operation that satisfies the ACLR standard.

Figure 5B:
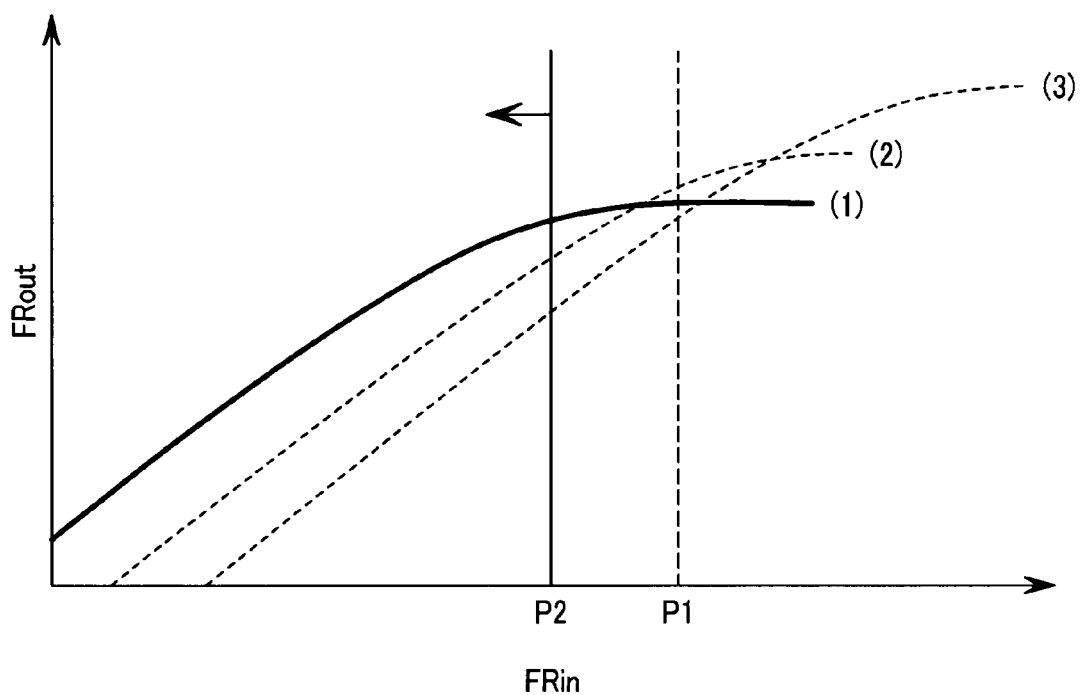
FIG. 5B is an explanatory diagram showing an operating characteristic according to the second embodiment of the present invention.

In this embodiment, the information that is obtained by the first detector unit 30 allows the gain of the gain variable amplifier 12 to be controlled according to the output voltage amplitude of the amplification transistor. Therefore, when the load impedance is large, the output of the gain variable amplifier 12, that is, the input signal amplitude of the power amplifier is suppressed to a value P2 that is smaller than P1, as shown in FIG. 5B. For that reason, the power amplifier operates in a region where no output distortion occurs at a further left side than P2.

In fact, the threshold voltage is set in a range where no output suppression signal occurs with respect to the gain variable amplifier 12 under the specified output in the normal operation of the matching of 50 ohms, thereby making it possible to operate in a lower distortion state at the time of the load impedance fluctuation. This fact is applied to other embodiments that will be described later.

Also, in the case where the gain variable amplifier 12 is structured to have multiple stages and the load impedance is large, the gain as a whole can be made to be a predetermined value by limiting each gain of each stage.

When the inventors actually made the power amplifier 10 shown in FIG. 2, composed a transmit system shown in FIG. 3, experimented, and optimized the above threshold value, ACLR<−36 dBc was obtained under the load fluctuation condition of up to VSWR=4:1.

Also, according to this embodiment, a circuit configuration for ensuring the linearity is simple, and an influence of an addition of the above circuit configuration on the size and costs of the high frequency power amplifier or the transmitter using the high frequency power amplifier is small. In other words, in the configuration of this embodiment, a circuit that is added to the normal power amplifier 10 is only a voltage detector unit indicated by reference numeral 30 in FIG. 2. In the voltage detector unit 30, the voltage detection diode 300 can be realized by diode connection of the transistor. Also, both of the voltage detection resistor 301 and the capacitor 302 can be produced by a normal MMIC process. As a result that the voltage detector circuit 30 is incorporated into the power amplifier for the W-CDMA, an increase in the MMIC chip area stays within 5%.

As described above, according to the present invention, the AC voltage amplitude Vdetout at the output terminal of the final amplification stage transistor 200 as shown in FIG. 4B is detected, and when a condition under which the distortion occurs is satisfied, that is, when the output voltage amplitude of the amplification transistor exceeds a predetermined threshold value, since a signal that suppresses the input signal amplitude of the power amplifier is outputted, the operation region of the power amplifier is limited. As a result, excellent linearity can be held regardless of the fluctuation of the load impedance. Moreover, an increased area of the MMIC chip area is very slight as compared with the normal power amplifier 10, and it is possible to provide a high frequency power amplifier that is small in the size and low in the costs, and a mobile communication terminal using the power amplifier.

Third Embodiment

A third embodiment of the present invention will be described with reference to FIGS. 6A and 6B. In this embodiment, the high frequency power amplifier shown in FIG. 2 or 3 is applied to a mobile communication terminal of the W-CDMA system.

Figure 6A:
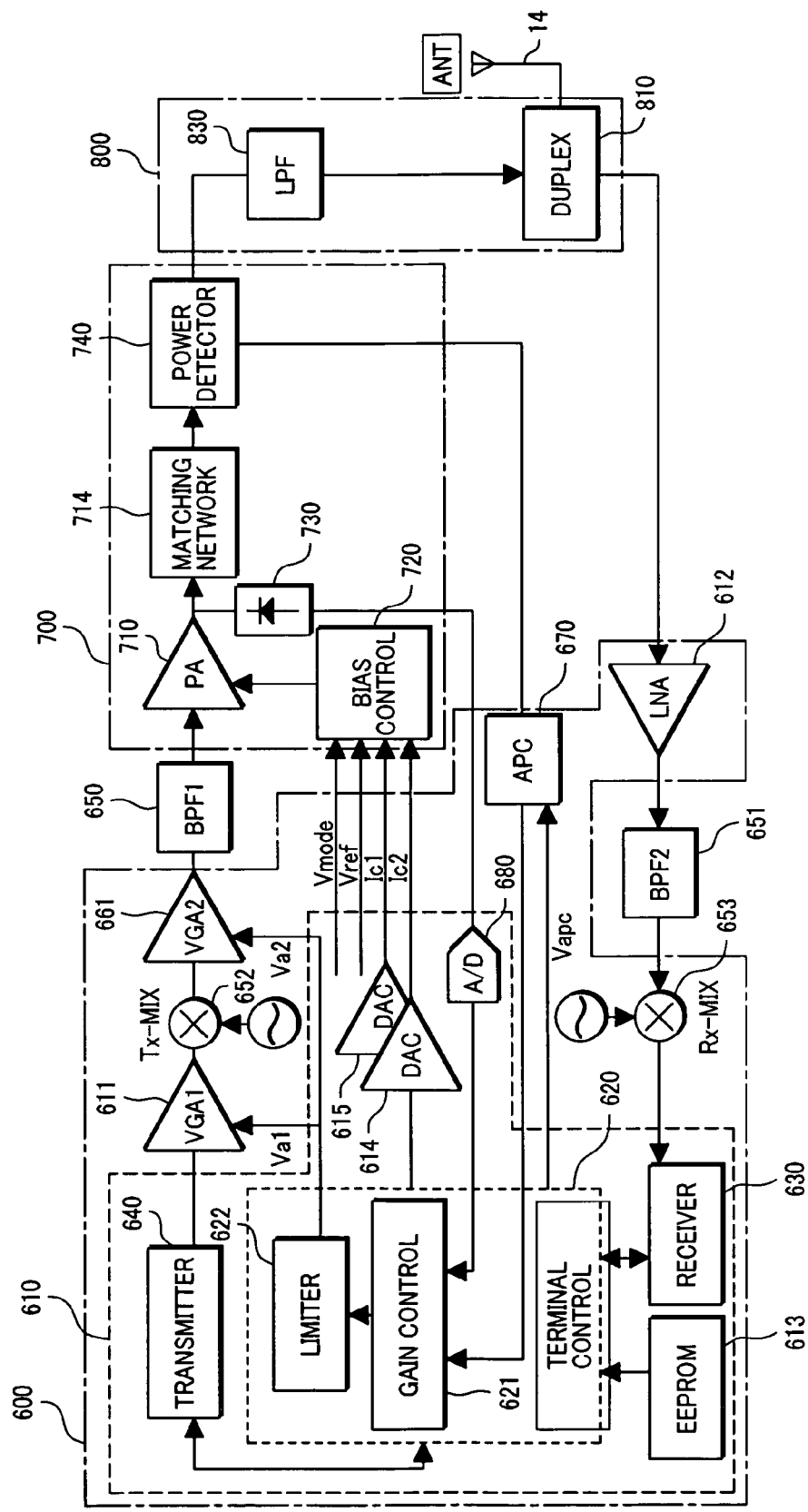
FIG. 6A is a diagram showing a structural example of a mobile communication terminal of a W-CDMA system according to a third embodiment of the present invention.

A mobile communication terminal shown in FIG. 6A includes a high frequency signal processor circuit that has a modulator and demodulator circuit which is capable of modulating and demodulating the W-CDMA signal, and is brought into a semiconductor integrated circuit. That is, the mobile communication terminal includes an electronic device 600, a high frequency power amplifier (power module) 700, and a front end module 800.

In the electronic device 600 corresponding to the base band control circuit (base band IC) shown in FIG. 3, a modulator and demodulator circuit which is capable of modulating and demodulating the W-CDMA signal, and a base band circuit 610 that generates I and Q signals or processes the I and Q signals that have been extracted from a receive signal on the basis of transmit data (base band signal) are incorporated into one package together with a band pass filter (BPF1) 650 that removes a high frequency component from the transmit signal, and a band pass filter (BPF2) 651 that removes an unnecessary wave from the receive signal.

The electronic device 600 according to this embodiment has, formed on one semiconductor chip: the base band circuit 610 including a terminal control unit 620 that processes the high frequency signal; a receiver unit 630; a transmitter unit 640; transmit variable gain amplifiers (GCA) 611 and 661 that amplify the transmit signal that has been modulated; a mixer (Tx-MIX) 652 that up-converts the transmit signal that has been amplified; a low noise amplifier (LNA) 612 that amplifies the receive signal; and a mixer (Rx-MIX) 653 that down-converts the receive signal that has been amplified.

In addition, the electronic device 600 is equipped with a nonvolatile memory 613 that stores table data that is referred to at the time of outputting a control current, and DA converter circuits 614 and 615 that subject data that has been read from the nonvolatile memory 613 and processed by the terminal control unit 620 of the base band circuit 610 to DA conversion, and output the converted data as analog currents.

The high frequency power amplifier (power module) 700 has a high frequency power amplifier 710 that amplifies the high frequency signal, a matching circuit 714, an A/D converter 680, a bias control circuit 720, and a collector AC voltage detector unit (first detector unit) 730 mounted on one ceramic substrate.

The radio communication system also includes a switch (DUPLEXER) 810 that is disposed in the front end module 800 for changing over transmit and receive, an output detector circuit (PDT) 740 made up of a coupler that detects an output level of the transmit signal which is outputted from the power module 700, a filter (LPF) 830 that removes noise such as a higher harmonic wave included in the transmit signal, and an automatic power control circuit (APC circuit) 670 that generates an output control signal Vapc with respect to the transmit variable gain amplifiers (GCA) 611 and 661 within the electronic device 600 on the basis of the output detection signal from the detector circuit 740 and the power control signal PCS from the base band circuit 610.

In the radio communication system according to this embodiment, the control current and the mode control signal with respect to the bias circuit 720 within the power module 700 are supplied from the base band circuit 610 of the electronic device 600. Also, a reference voltage that is inputted to the voltage to current converter circuit and the offset current adder circuit within the bias circuit 720 is also supplied from the base band circuit 610.

In this embodiment, the output control signal that is outputted from the automatic power control circuit 670 which controls the output level is supplied to the transmit variable gain amplifiers 611 and 661 within the electronic device 600 in a state where the gains of the initial stage amplification transistor and the final stage amplification transistor in the power amplifier 710 are held constant according to the control currents Ic1 and Ic2 which are supplied from the base band circuit 610. Then, the gains of the transmit variable gain amplifiers 611 and 661 are controlled according to the output control signal Vapc. As a result, the output power of the power amplifier 710 is changed under the control. A power compensation function is given to the bias circuit 720 that supplies a bias to the power amplifier 710, thereby making it possible to maintain the gain of the power amplifier 710 substantially constant even if the supply voltage changes due to the charge or consumption of a battery. As a result, the receive band noise is capable of satisfying the standard. Also, the table data that is a base for generating the power control signal PCS that is supplied to the automatic power control circuit 670 according to the output request level which is supplied from a base station is also stored in the nonvolatile memory 613.

In this embodiment, a down receive signal from the base station is received by the antenna 14 of the mobile communication terminal, and then inputted to the low noise amplifier (LNA) 612 through the transmit/receive separation filter (DUPLEXER) 810. Thereafter, the download signal is down-converted by the mixer 653 through the band pass filter 651, adjusted to a desired level by the receive variable gain amplifier, and then converted into the receive base band signal. The receive base band signal is extracted by the receiver unit 630. Also, the receive base band signal is branched and transmitted to the gain control unit 621 that generates the receive gain control signal which allows the receive base band signal to be a desired constant level, which controls the receive variable gain amplifier.

The transmit base band signal that has been generated by the transmitter unit 640 is converted into a transmit intermediate frequency through an orthogonal converter, and the transmit level is adjusted by the variable gain amplifier 611. Thereafter, the adjusted signal is amplified into a desired transmit output by the power amplifier 710 through the mixer 652 and the base band filter 650, and then emitted as an up transmit signal from the antenna 14 through a directional coupler and the transmit/receive separation filter (DUPLEXER) 810. Also, the transmit gain control signals Va1 and Va2 that control the gains of the variable gain amplifier 611 and 661 are supplied to the transmit variable gain amplifiers 611 and 661 through the limiter 622, and control is made so that the gains of the transmit variable gain amplifiers 611 and 661 are not excessive. The limit value is set by the terminal control unit 620.

As the adjustment of the transmit levels in the transmit variable gain amplifiers 611 and 661, in order to keep the quality of an up link of the base station, the mobile communication terminal transmits with a large power when the mobile communication terminal is apart from the base station, and the transmit power is lowered when the mobile communication terminal is close to the base station. The base station monitors the quality of the up link signal, and then instructs the down link signal so as to increase the transmit power of the mobile communication terminal when the quality of the up link signal is deteriorated. The base station also instructs the down link signal so as to decrease the transmit power of the mobile communication terminal when the quality of the up link signal is equal to or higher than a given quality. The mobile communication terminal extracts those information in the receiver unit 630, and transmits those information to the gain control unit 621 of the terminal control unit 620. Also, the gain control information of the gain variable amplifiers 611 and 661 which are detected by the collector AC voltage detector unit 730 is also transmitted to the gain control unit 621. The gain control unit 621 generates the transmit gain control signal Va according to those information.

The transmit gain control signals Va1 and Va2 control the gains of the transmit variable gain amplifiers 611 and 661. The transmit gain control signals Va1 and Va2 are supplied to the transmit variable gain amplifiers 611 and 661 through the limiter 622 where control is made so that the gains of the transmit variable gain amplifiers 611 and 661 are not excessive. This is because in the case where the up transmit power that is requested from the base station is too large, the transmit signal is prevented from being distorted by the power amplifier 710 to spread the spectrum toward the adjacent frequencies and interfere with the adjacent frequencies.

Figure 6B:
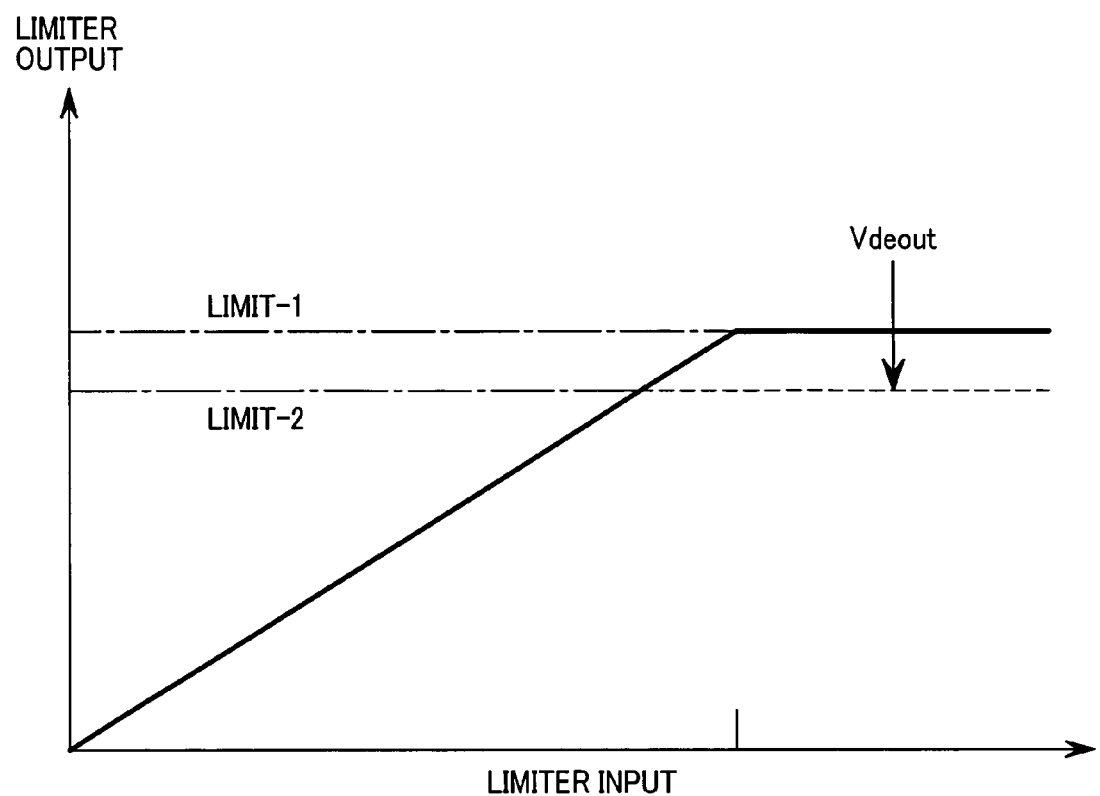
FIG. 6B is an explanatory diagram showing an operating characteristic according to the third embodiment of the present invention.

To achieve this, the limiter 622 has the input to output characteristic as shown in FIG. 6B. For example, the limiter 622 conducts limiter operation that limits a limiter input that is equal to or higher than a predetermined value to a limit value (=limit-1) on the basis of the basic information such as the channel frequency information. The limit value determines the maximum transmit power of the mobile communication terminal.

In this embodiment, the gain control information of the gain variable amplifiers 611 and 661 is transmitted to the gain control unit 621 of the terminal control unit 620 in addition to the basic information. With this operation, in the case where Vdetout that is detected by the collector AC voltage detector unit 730 to exceed the given value even if the maximum transmit power is within the limit value (=limit-1), the limit value is changed to a smaller value (=limit-2) to suppress the maximum transmit power.

According to this embodiment, it is possible to provide the mobile communication terminal of the W-CDMA system which maintains excellent linearity regardless of the fluctuation of the load impedance, and is readily downsized.

Fourth Embodiment

Now, a description will be given of the structure of a fourth embodiment of the present invention with reference to FIGS. 7 to 10. A power amplifier 10 shown in FIG. 7 is changed in the power amplifier 10 shown in FIG. 2 in such manner that an output of a collector AC voltage amplitude detector circuit (first detector unit) 30 and a supply voltage Vcc are inputted to a signal processor 305, and a signal processing result from the signal processor 305 is outputted as an output Vdetout of the AC voltage amplitude.

Figure 7:
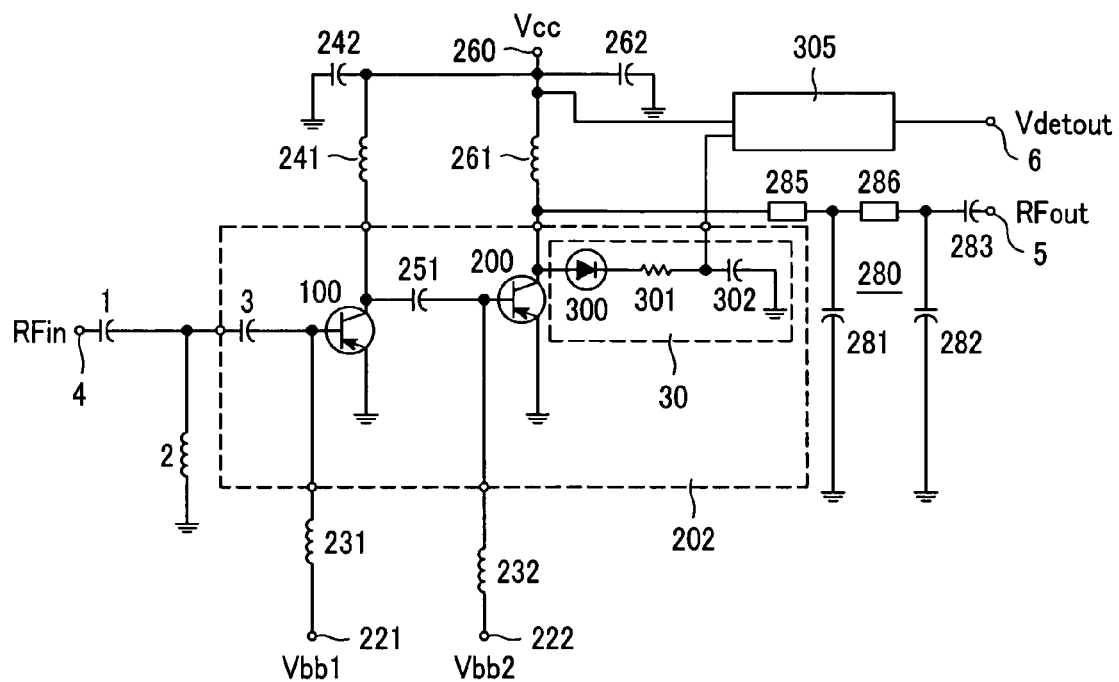
FIG. 7 is a circuit diagram showing a power amplifier according to a fourth embodiment of the present invention.
Figure 8:
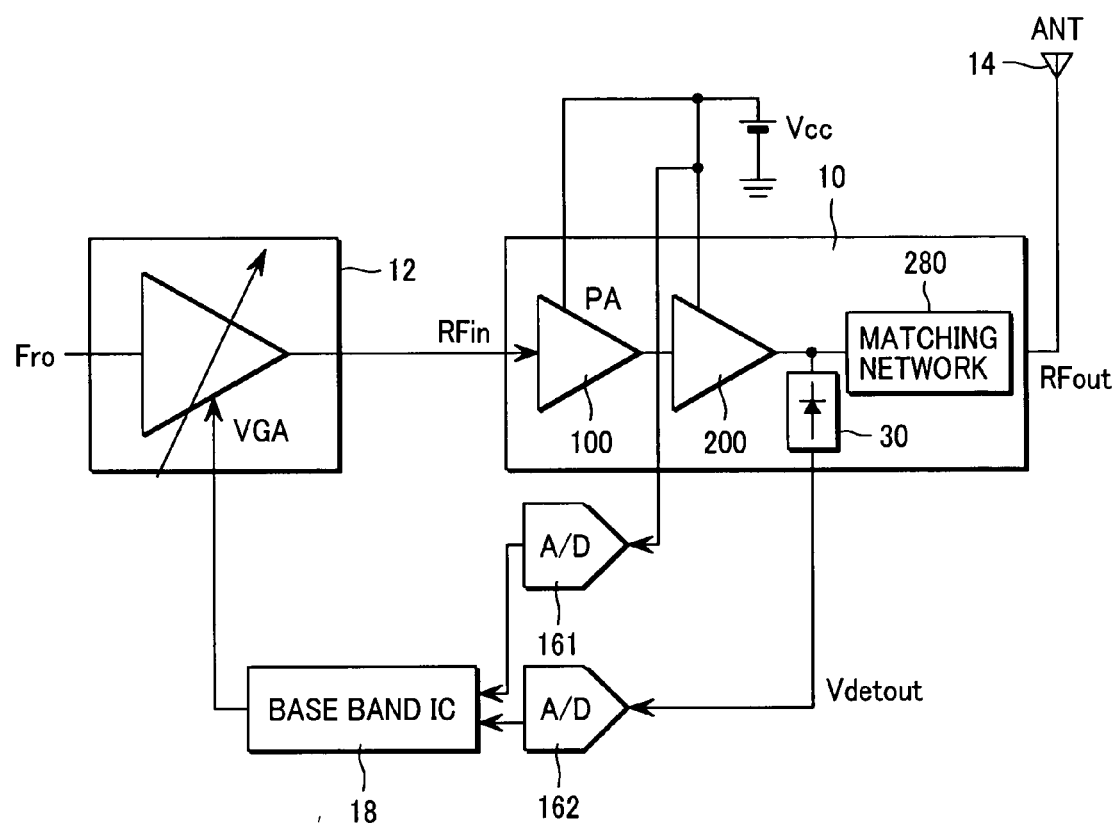
FIG. 8 is a block diagram showing a transmitter using the power amplifier according to the fourth embodiment of the present invention.

FIG. 8 is a block diagram showing the structure of a transmitter in a mobile terminal of the W-CDMA system to which the power amplifier 10 shown in FIG. 7 is applied. The power amplifier 10 has an input terminal 4 of the high frequency signal RFin connected to an external gain variable amplifier 12 and an output terminal 5 of the high frequency signal RFout connected to an antenna 14. Also, a supply terminal 260 that is connected with the supply voltage Vcc is connected to a control circuit (base band IC) 18 through an A/D converter 161. Further, an AD voltage amplitude output Vdetout that is outputted from an output terminal 6 of a collector AD voltage detector unit 30 in the power amplifier 10 is inputted to the control circuit (base band IC) 18 through an A/D converter 162.

The power amplifier 10 is inputted with the high frequency signal RFin obtained by modulating a carrier wave in phase, and the amplified high frequency signal RFout drives the antenna 14 to conduct transmission. The control circuit 18 controls the gain of the gain variable amplifier 12 according to the supply voltage Vcc and the output Vdetout of the AC voltage amplitude.

Figure 9:
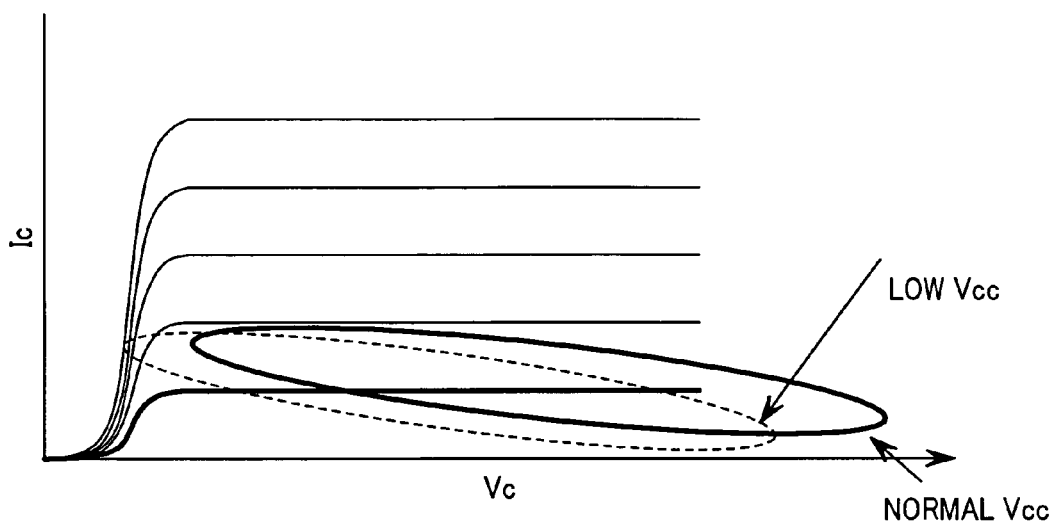
FIG. 9 is a schematic diagram showing a principle of the occurrence of a distortion accompanying a supply voltage fluctuation in the fourth embodiment of the present invention.
Figure 10:
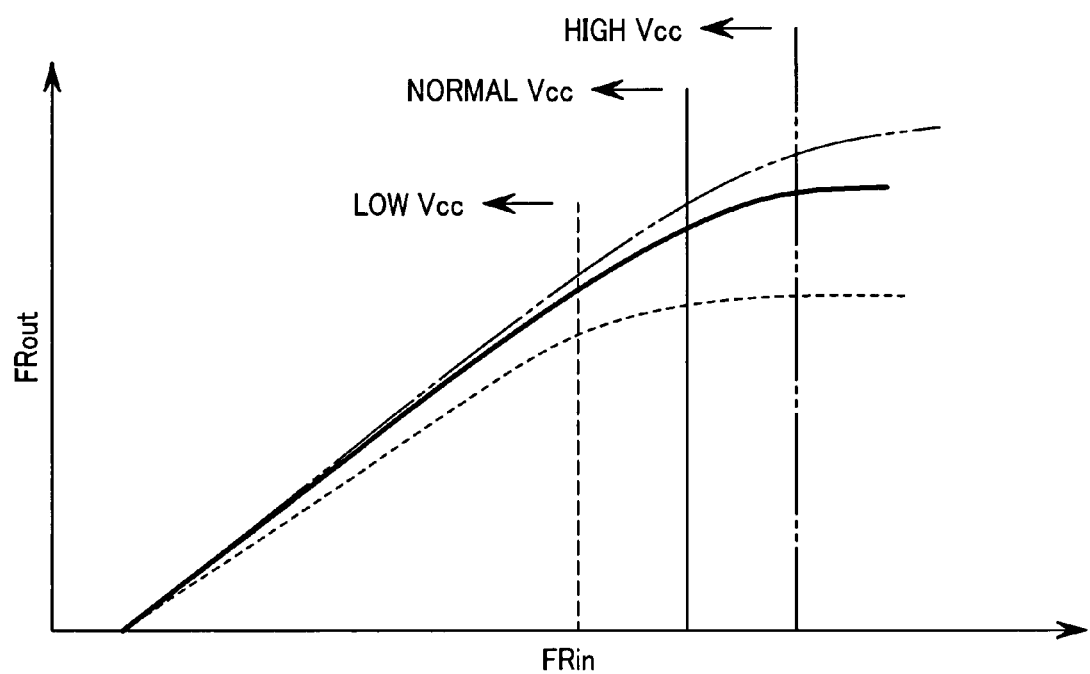
FIG. 10 is an explanatory diagram showing the operating characteristic according to the fourth embodiment of the present invention.

As shown in FIG. 9, there is a case in which a distortion occurs when the supply voltage Vcc is reduced even under the condition where no distortion occurs in the supply voltage during the normal operation of the power amplifier 10. FIG. 10 shows this condition by the input to output characteristic of the power amplifier 10. The saturated output is lowered with a reduction of the supply voltage, and the linearity is lost at a lower output so that the distortion can occur.

In this embodiment, in order to suppress the occurrence of distortion due to the supply voltage reduction, the supply voltage and the collector AC voltage amplitude are signal processed, to thereby allow the gain suppression threshold value of the gain variable amplifier to change according to the supply voltage, and the gain variable amplifier 12 is controlled so that the input signal amplitude of the power amplifier 10 becomes equal to or lower than a predetermined value. With the above operation, the occurrence of the distortion at the time of the supply voltage reduction is suppressed. Also, since the self bias system by which the bias current changes according to the amplitude of the RF input signal RFin of the power amplifier is applied, the bias current is reduced as the amplitude of the RF input signal is reduced. As result, the ensuring of the linear operation region is further facilitated.

As a comparative example, in the case where the amplifier 10 that has acquired the characteristic of FIG. 5A is made to operate while the above threshold voltage is constantly kept at 3 V, and the supply voltage is reduced from the standard voltage of 3.5 V, the worst value of the ACLR exceeds −33 dBc when the supply voltage is reduced down to 3.2 V, and the 3GPP standard is not satisfied.

On the other hand, in the case where the signal processor circuit according to this embodiment is optimized, even if the supply voltage is reduced down to 2.8 V, the worst value of the ACLR remains at −36 dBc, and a margin can be taken with respect to the 3GPP standard.

Fifth Embodiment

Figure 11:
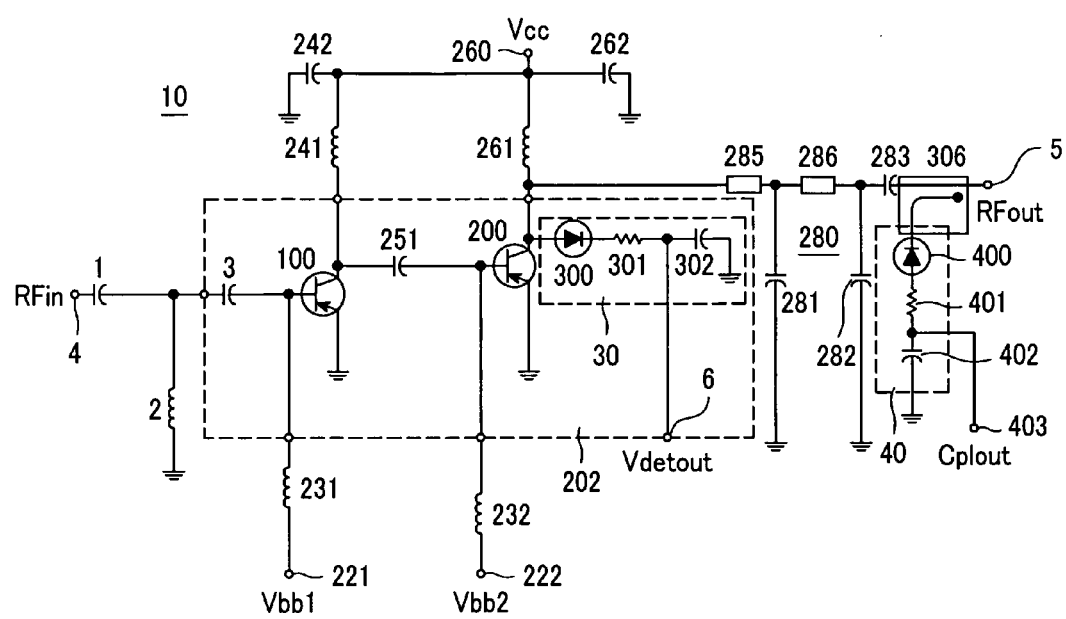
FIG. 11 a circuit diagram showing a power amplifier according to a fifth embodiment of the present invention.

A description will be given of a high frequency power amplifier according to a fifth embodiment of the present invention with reference to FIGS. 11 and 12. As shown in FIG. 11, the fifth embodiment includes a second detector unit 40 in addition to the collector AC voltage detector unit (first detector unit) 30 shown in FIG. 2. That is, a directional coupler 306 is provided in the output matching circuit as the second detector unit 40, and its output signal is detected by the detector circuit 40 and outputted from a terminal 403 as Cplout. The second detector section 40 is made up of a voltage detection diode 400, a voltage detection resistor 401, and a voltage detection capacitor element 402.

Figure 12:
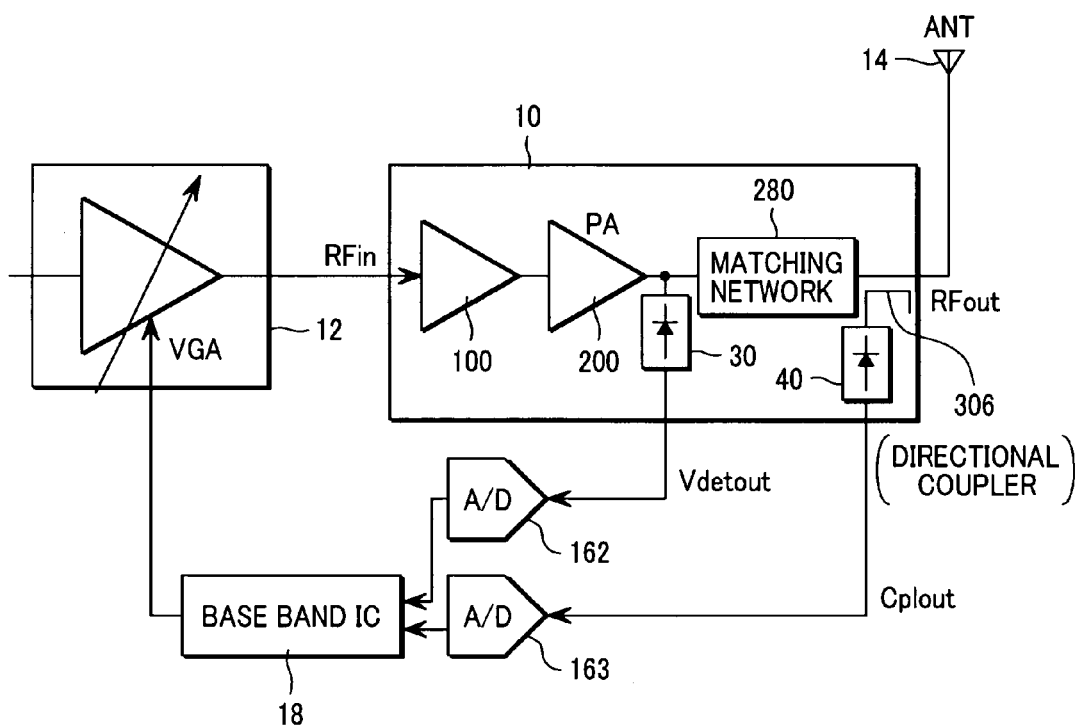
FIG. 12 is a block diagram showing a transmitter using the power amplifier according to the fifth embodiment of the present invention.

FIG. 12 is a block diagram showing the structure of a transmitter in a mobile terminal of the W-CDMA system to which the power amplifier 10 shown in FIG. 11 is applied. The power amplifier 10 has a signal input terminal RFin 4 connected to an external gain variable amplifier 12 and an output terminal RFout 5 connected to an antenna 14. Also, an AC voltage amplitude output Vdetout that is outputted from the output terminal 6 of the collector AC voltage detector unit 30 in the power amplifier 10 is connected to a control circuit (base band IC) 18 through an A/D converter 162. Further, a terminal 403 of the output signal Cplout of the directional coupler 306 in the output matching circuit is connected to the control circuit (base band IC) 18 through an A/D converter 163 as a second detector unit 40.

The power amplifier 10 is inputted with the high frequency signal RFin obtained by modulating a carrier wave in phase according to information to be transmitted, and the amplified high frequency signal RFout drives the antenna 14 to conduct transmission. The control circuit 18 controls the gain of the gain variable amplifier 12 according to the supply voltage Vcc and the output Vdetout of the AC voltage amplitude.

The characteristic fluctuation of the amplifier accompanying the signal load impedance fluctuation is substantially symmetrical with respect to the phase of the load impedance as shown in FIG. 5A. In FIG. 5A, its symmetrical axis is 30° and 120° in a ½ phase angle value. Accordingly, the output Cplout from the directional coupler 306 for detecting the electric power of a traveling wave that progresses from the power amplifier 10 toward the antenna 14 is obtained by the second detector unit. Also, the information on the output Vdetout of the first detector unit that detects the AC voltage at the collector terminal which is obtained by superimposing the traveling wave on the reflective wave from the antenna 14, thereby making it possible to know the traveling wave amplitude and the amplitude and phase of the reflective wave. Therefore, those signals are processed with the result that not only the distortion of the amplifier is reduced which is a primary object of the present invention, but also functions of a higher level can be realized. For example, in a state (3) of FIG. 4A, the collector current of the final stage transistor 200 becomes excessive due to the fluctuation of the load impedance. However, the use of the circuit according to the present invention makes it possible to identify a condition under which the collector current becomes excessive according to the information on the traveling wave output, the amount of reflection of the reflective wave, and the phase of the reflective wave. In this case, the gain of the gain variable amplifier 12 is reduced so that flow of the excessive current can be suppressed. Also, since the amount of reflection from the antenna 14 can be detected according to the above information, it is possible to know the radiation from the antenna. With the above operation, the amount of radiation from the antenna is kept constant in an output range where no distortion occurs even if the condition around the antenna is changed, thereby making it possible to reduce the possibility of disconnecting the link which is attributable to the radiation output fluctuation due to a change in the condition around the antenna under the control.

Sixth Embodiment

Figure 13:
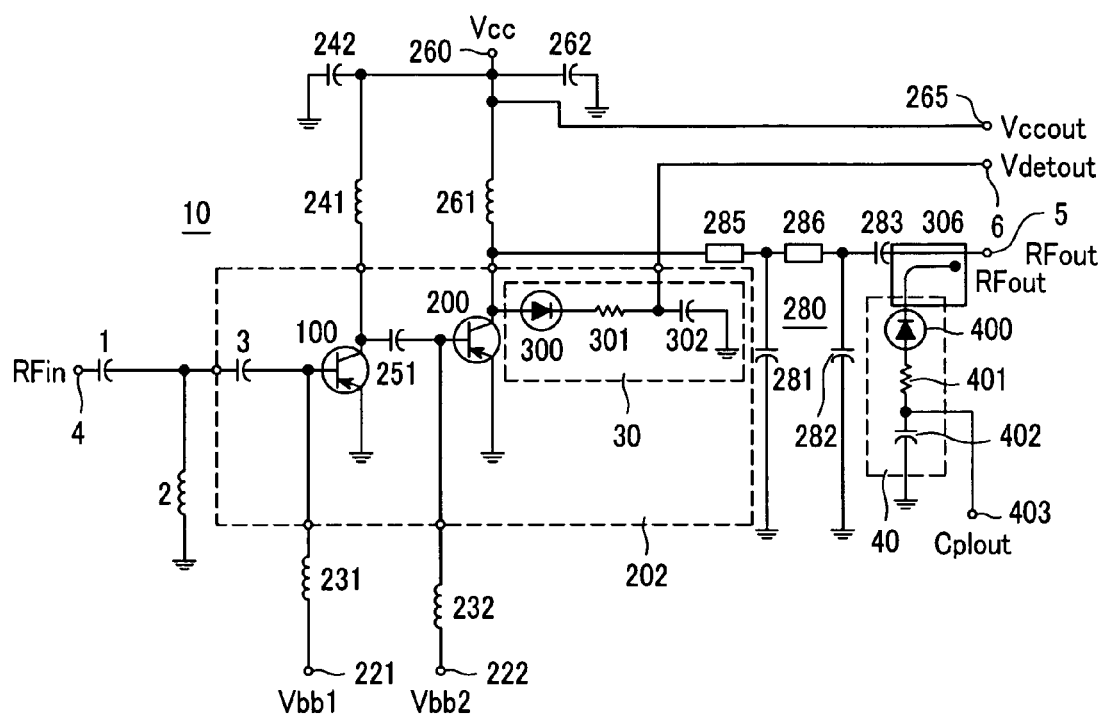
FIG. 13 is a circuit diagram showing a power amplifier according to a sixth embodiment of the present invention.
Figure 14:
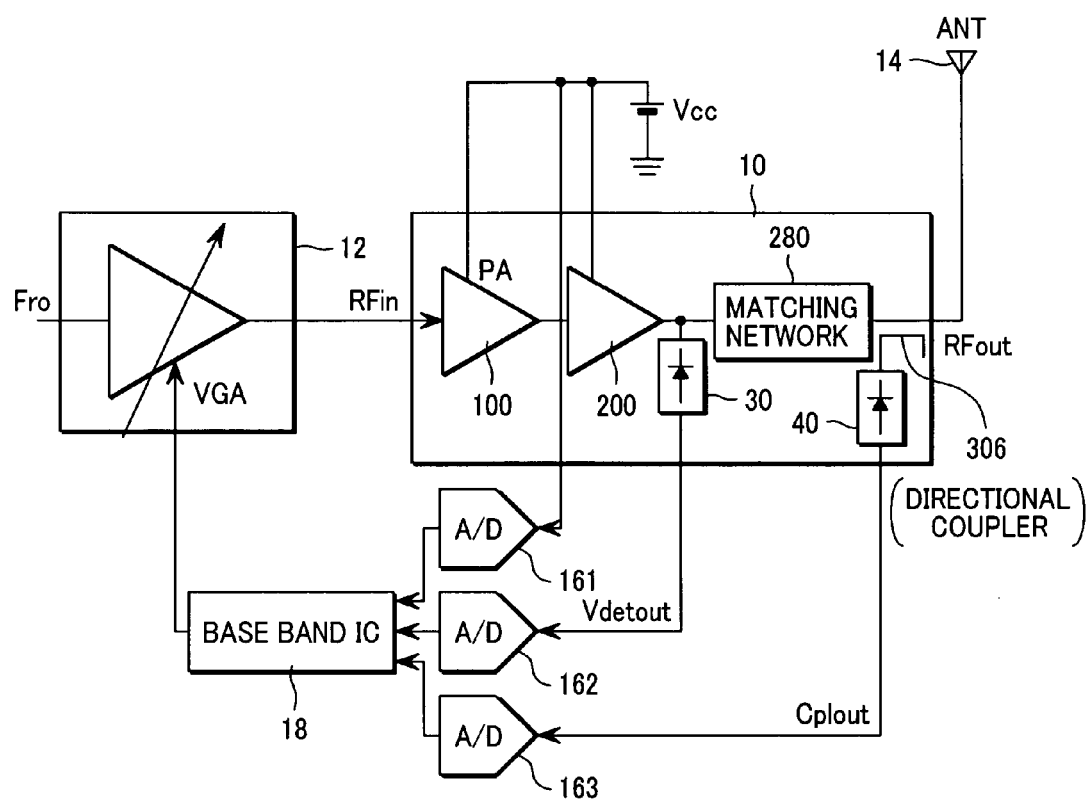
FIG. 14 is a block diagram showing a transmitter using the power amplifier according to the sixth embodiment of the present invention.

FIGS. 13 and 14 show a high frequency amplifier according to a sixth embodiment of the present invention.

A high frequency amplifier shown by a circuit diagram of FIG. 13 is a high frequency amplifier that is capable of detecting both of the supply voltage output described in the fourth embodiment and the traveling wave output using the directional coupler described in the fifth embodiment, which has both of the features of the fourth embodiment and the fifth embodiment.

FIG. 14 is a block diagram showing the structure of a transmitter using a power amplifier according to this embodiment. In other words, the gain of the gain variable amplifier is controlled according to the fluctuation of the supply voltage by using an optimum threshold value that is capable of suppressing the distortion to make the output of the terminal maximum while maintaining the signal quality. Also, the information on the second detector unit is used to maintain the radiation output from the antenna constant even in the case where a reflection occurs in the antenna at the time of the low output where the distortion leads to no problem, thereby making it possible to improve the stability of the link connection at the terminal.

As was described above, according to the respective embodiments, it is possible to provide a high frequency power amplifier that maintains the excellent linearity regardless of the fluctuation of the load impedance and is readily downsized, and a transmitter using the high frequency power amplifier.

It is needless to say that the same effects can be obtained by applying the high frequency amplifier and the transmitter described in the fourth to sixth embodiments to the mobile communication terminal of the W-CDMA system shown in FIG. 6.

Also, the present invention can be applied to an EDGE (Enhanced Data GSM Environment) which is one of the data transmission techniques using the GSM system or the TDMA system, likewise.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A high frequency power amplifier for use in a high frequency mobile communication terminal, comprising:
   at least one amplification stage that amplifies an input signal from a gain variable amplifier, wherein the at least one amplification stage includes an output amplification stage which comprises a transistor and constitutes a final stage of the at least one amplification stage;
   an output matching circuit that is connected to an output side of the final stage of the at least one amplification stage;
   a first detection unit that detects a voltage amplitude at a node between the transistor of the final stage of the at least one amplification stage and the output matching circuit, and outputs the voltage amplitude as a first signal of gain control information of the gain variable amplifier; and
   a supply voltage detector unit that detects a supply voltage being supplied to the final stage of the at least one amplification stage and outputs the supply voltage as a second signal of the gain control information of the gain variable amplifier,
   wherein the gain variable amplifier is controlled based on the gain control information so as to limit a gain of the gain variable amplifier upon the voltage amplitude exceeding a predetermined threshold voltage.

2. The high frequency power amplifier according to claim 1, further comprising a second detector unit that has a directional coupler which is disposed within the output matching circuit, or between the output matching circuit and the output terminal, and outputs an output signal of the directional coupler as a third signal of the gain control information of the gain variable amplifier.

3. The high frequency power amplifier according to claim 1, wherein the first detection unit includes a voltage detection diode that is connected to a collector of the transistor of the final stage of the at least one amplification stage, and a voltage detection resistor and a capacitor which are connected to the voltage detection diode.

4. The high frequency power amplifier according to claim 3, wherein the transistor of the final stage of the at least one amplification stage, an input matching capacitor and an inter-stage matching capacitor which are connected to the transistor of the final stage of the at least one amplification stage, and the first detection unit are constituted as an MMIC (microwave monolithic IC) of one chip.

5. The high frequency power amplifier according to claim 1, wherein the transistor of the final stage of the at least one amplification stage is of a self bias system in which a bias current with respect to the power amplifier changes according to an RF input voltage.

6. A transmitter for use in a high frequency mobile communication terminal, comprising:
   a high frequency power amplifier; and
   a control unit,
   wherein the high frequency power amplifier comprises:
   at least one amplification stage that amplifies an input signal from a gain variable amplifier, wherein the at least one amplification stage includes an output amplification stage which comprises a transistor for amplification and constitutes a final stage of the at least one amplification stage;
   an output matching circuit that is connected to an output side of the final stage of the at least one amplification stage;
   a first detection unit that detects a voltage amplitude at a node between the transistor of the final stage of the at least one amplification stage and the output matching circuit, and outputs the voltage amplitude as a first signal of gain control information of the gain variable amplifier; and
   a supply voltage detector unit that detects a supply voltage being supplied to the final stage of the at least one amplification stage of the power amplifier,
   wherein the control unit has a function of controlling the gain of the gain variable amplifier according to the first signal of gain control information from the first detection unit and a second signal of gain control information from the supply voltage detector unit, and
   wherein the control unit monitors the voltage amplitude of the first signal of gain control information and generates a control signal for limiting a gain of the gain variable amplifier upon the voltage amplitude exceeding a predetermined threshold voltage.

7. The transmitter according to claim 6, further comprising a second detector unit that has a directional coupler which is disposed within the output matching circuit, or between the output matching circuit and the output terminal, and outputs an output signal of the directional coupler as gain control information of the gain variable amplifier,
   wherein the control unit has a function of controlling the gain of the gain variable amplifier according to the first signal from the first detection unit and a third signal that is obtained from the second detector unit.

8. The transmitter according to claim 7, further comprising a second detector unit that has a directional coupler which is disposed within the output matching circuit, or between the output matching circuit and the output terminal, and outputs an output signal of the directional coupler as gain control information of the gain variable amplifier, wherein the control unit has a function of controlling the gain of the gain variable amplifier according to the first signal from the first detection unit, the second signal from the supply voltage detector unit, and a third signal that is obtained from the second detector unit.

9. The transmitter according to claim 6, wherein a signal that suppresses an input signal amplitude of the power amplifier is inputted to the gain variable amplifier when the output voltage amplitude of the power amplifier exceeds a predetermined threshold value.

10. The transmitter according to claim 6, wherein the control unit is disposed within a base band control circuit.

11. A mobile communication terminal, comprising:
a base band circuit having a limiter that determines a maximum transmit power of the mobile communication terminal;
a transmit variable gain amplifier;
a high frequency power amplifier that amplifies a transmit signal;
a front end module; and
an antenna,
wherein the base band circuit has a function of supplying a transmit gain control signal that is generated by a terminal control unit to the transmit variable gain amplifier through the limiter,
wherein the high frequency power amplifier includes a high frequency power amplifier circuit that amplifies a high frequency signal, an output matching circuit, a bias control circuit, a first detection unit that detects a voltage amplitude at a node between a transistor of a final stage of at least one amplification stage of the high frequency power amplifier circuit and the output matching circuit, and outputs the voltage amplitude as a first signal of gain control information of the transmit gain variable amplifier, and a supply voltage detector unit that detects a supply voltage being supplied to the final stage of the at least one amplification stage and outputs the supply voltage as a second signal of the gain control information of the transmit gain variable amplifier,
wherein the at least one amplification stage of the high frequency power amplifier circuit amplifies an input signal from a gain variable amplifier,
wherein the at least one amplification stage includes an output amplification stage which constitutes the final stage of the amplification stage,
wherein the output matching circuit is connected to an output side of the final stage of the at least one amplification stage,
wherein the front end module includes a changeover switch for transmission and reception, an output detector circuit that detects an output level of the transmit signal which is outputted from the high frequency power amplifier, and an automatic power control circuit that generates an output control signal with respect to the gain variable amplifier,
wherein there are provided functions of generating a control current with respect to the bias control circuit in the base band circuit, and generating transmit level adjustment information for monitoring a quality of a signal which is attributable to a positional relationship between the mobile communication terminal and a base station and adjusting a transmit level in the transmit variable gain amplifier,
wherein there is provided a function of changing a limit value of the limiter on the basis of the transmit level adjustment information and the gain control information, and
wherein the gain variable amplifier is controlled based on the gain control information so as to limit a gain of the gain variable amplifier upon the voltage amplitude exceeding a predetermined threshold voltage.

12. The mobile communication terminal according to claim 11, further comprising a modulator and demodulator circuit for modulating and demodulating the W-CDMA signal.

13. The mobile communication terminal according to claim 11, further comprising a modulator and demodulator circuit for conducting modulation and demodulation due to an EDGE system.

14. The mobile communication terminal according to claim 11, wherein there is provided a function of changing the limit value of the limiter on the basis of the transmit level adjustment information, the gain control information, and the supply voltage information of the high frequency power amplifier.

15. The mobile communication terminal according to claim 11, wherein the first detection unit detects a collector voltage of the transistor, and outputs the collector voltage as the gain control information of the gain variable amplifier.

16. The mobile communication terminal according to claim 11, further comprising a second detector unit that has a directional coupler which is disposed within the output matching circuit, or between the output matching circuit and the output terminal, and outputs an output signal of the directional coupler as a third signal of the gain control information of the gain variable amplifier,
wherein there is provided a function of changing the limit value of the limiter according to the transmit level adjustment information, the gain control information that is obtained from the second detector unit, the supply voltage information of the high frequency power amplifier, and the gain control information that is obtained from the first detection unit.

17. The mobile communication terminal according to claim 16, wherein the directional coupler and the antenna are connected to each other through no isolator.

* * * * *